United States Patent
Wang et al.

(10) Patent No.: US 10,461,079 B2
(45) Date of Patent: Oct. 29, 2019

(54) METHOD AND DEVICE OF PREVENTING MERGING OF RESIST-PROTECTION-OXIDE (RPO) BETWEEN ADJACENT STRUCTURES

(71) Applicant: TAIWAN SEMICONDUCTOR MANUFACTURING CO., LTD., Hsinchu (TW)

(72) Inventors: Chen-Han Wang, Zhubei (TW); Chun-Hsiung Lin, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/046,467

(22) Filed: Jul. 26, 2018

(65) Prior Publication Data
US 2018/0350805 A1 Dec. 6, 2018

Related U.S. Application Data

(62) Division of application No. 15/064,647, filed on Mar. 9, 2016.
(Continued)

(51) Int. Cl.
*H01L 27/088* (2006.01)
*H01L 21/8234* (2006.01)
(Continued)

(52) U.S. Cl.
CPC .......... *H01L 27/0886* (2013.01); *H01L 21/32* (2013.01); *H01L 21/823418* (2013.01);
(Continued)

(58) Field of Classification Search
None
See application file for complete search history.

(56) References Cited

U.S. PATENT DOCUMENTS 8,216,767 B2   7/2012   Wang et al.
8,323,870 B2   12/2012  Lee et al.
(Continued)

FOREIGN PATENT DOCUMENTS

CN   102034866 A   4/2011
CN   103311237 A   9/2013
(Continued)

*Primary Examiner* — Raj R Gupta
(74) *Attorney, Agent, or Firm* — Haynes and Boone, LLP

(57) ABSTRACT

A semiconductor device having a first region and a second region is provided. The first region has a first protruding structure and a second protruding structure. The second region has a third protruding structure and a fourth protruding structure. First, second, third, and fourth epi-layers are formed on the first, second, third, and fourth protruding structures, respectively. The first and second epi-layers are covered with a first photoresist layer while leaving the third and fourth epi-layers exposed. A dielectric layer is formed over the first photoresist layer and over the third and fourth epi-layers. A portion of the dielectric layer is covered with a second photoresist layer. The portion of the dielectric layer is formed over the third and fourth epi-layers. Portions of the dielectric layer not protected by the first and second photoresist layers are etched. The first and second photoresist layers are removed.

20 Claims, 11 Drawing Sheets

Related U.S. Application Data

(60) Provisional application No. 62/288,599, filed on Jan. 29, 2016.

(51) Int. Cl.
    *H01L 21/32*       (2006.01)
    *H01L 29/417*     (2006.01)
    *H01L 21/8238*    (2006.01)
    *H01L 27/092*     (2006.01)

(52) U.S. Cl.
    CPC ........ *H01L 21/823431* (2013.01); *H01L 21/823481* (2013.01); *H01L 29/41791* (2013.01); *H01L 21/823814* (2013.01); *H01L 21/823821* (2013.01); *H01L 21/823878* (2013.01); *H01L 27/0924* (2013.01)

(56) References Cited

U.S. PATENT DOCUMENTS

| | | | |
|---|---|---|---|
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 9,559,008 B2 | 1/2017 | Lin et al. | |
| 9,647,115 B1 * | 5/2017 | Okuno | H01L 21/76805 |
| 9,698,060 B2 | 7/2017 | Yeh et al. | |
| 9,754,940 B2 | 9/2017 | Glass et al. | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2015/0041913 A1 * | 2/2015 | An | H01L 29/7856 257/369 |
| 2015/0069473 A1 | 3/2015 | Glass et al. | |
| 2015/0228647 A1 | 8/2015 | Chang et al. | |
| 2015/0236131 A1 | 8/2015 | Chang et al. | |
| 2016/0099342 A1 * | 4/2016 | Basker | H01L 27/0924 438/283 |

FOREIGN PATENT DOCUMENTS

| | | |
|---|---|---|
| CN | 104011870 A | 8/2014 |
| CN | 104124160 A | 10/2014 |
| CN | 104183488 A | 12/2014 |
| TW | 201543575 A | 11/2015 |
| TW | 201601219 A | 1/2016 |

* cited by examiner

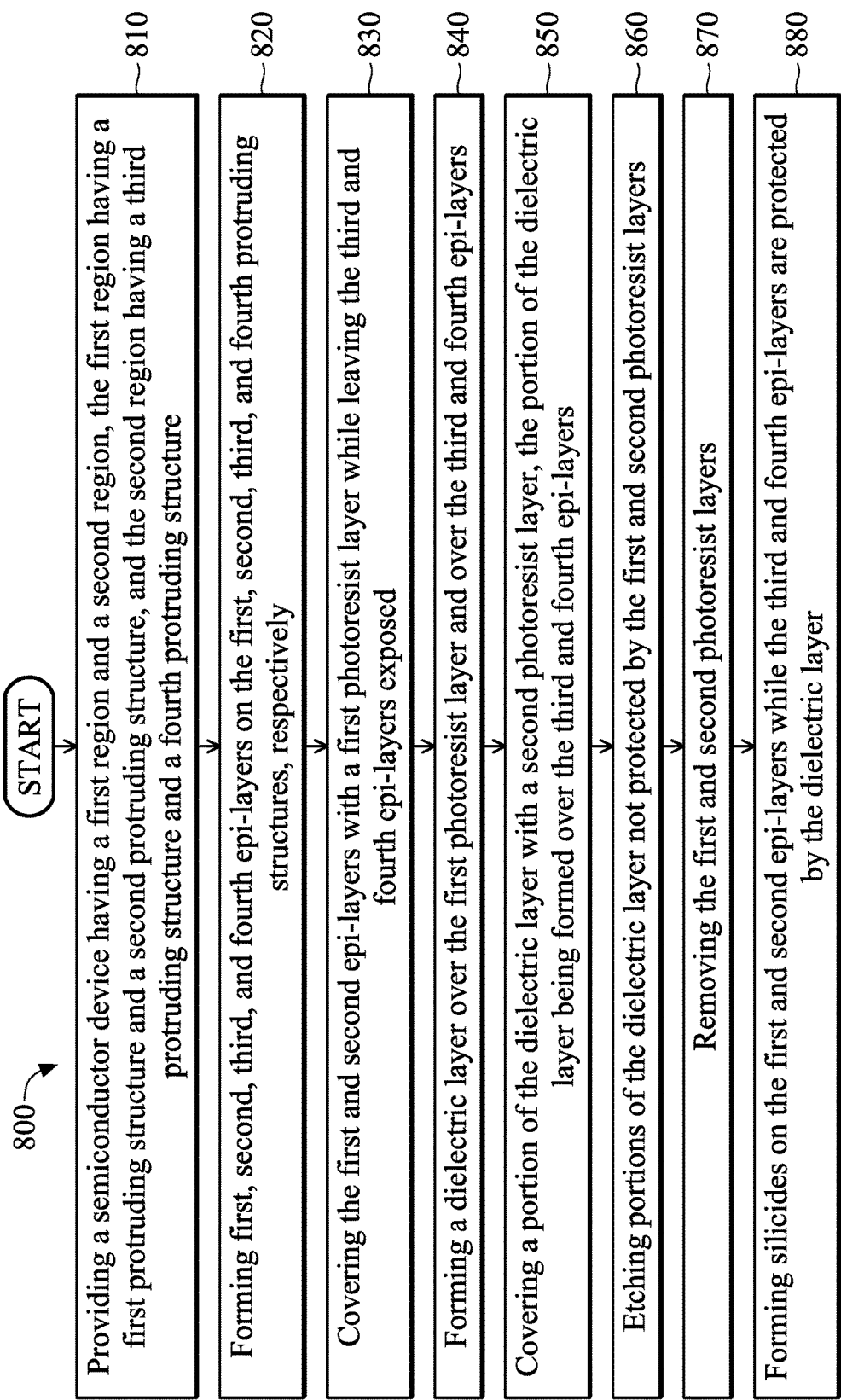

METHOD AND DEVICE OF PREVENTING MERGING OF RESIST-PROTECTION-OXIDE (RPO) BETWEEN ADJACENT STRUCTURES

PRIORITY DATA

This application is a divisional of U.S. application Ser. No. 15/064,647, filed Mar. 9, 2016 which claims benefit of U.S. Provisional Application No. 62/288,599, filed Jan. 29, 2016, both of which are herein incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The ever-shrinking geometry size brings challenges to semiconductor fabrication. For example, semiconductor device fabrication may involve forming a resist-protection-oxide (RPO) layer over and around protruding structures (e.g., fin structures of FinFETs). However, as device sizes become small enough, the RPO layer formed between adjacent protruding structures may merge with each other. The merged RPO layer is difficult to remove, and its removal may cause other problems that may degrade the electrical performance of the semiconductor device.

Therefore, while existing semiconductor devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 11 is a flowchart illustrating a method of fabricating a semiconductor device according to embodiments of the present disclosure.

DETAILED DESCRIPTION

Figure 1:
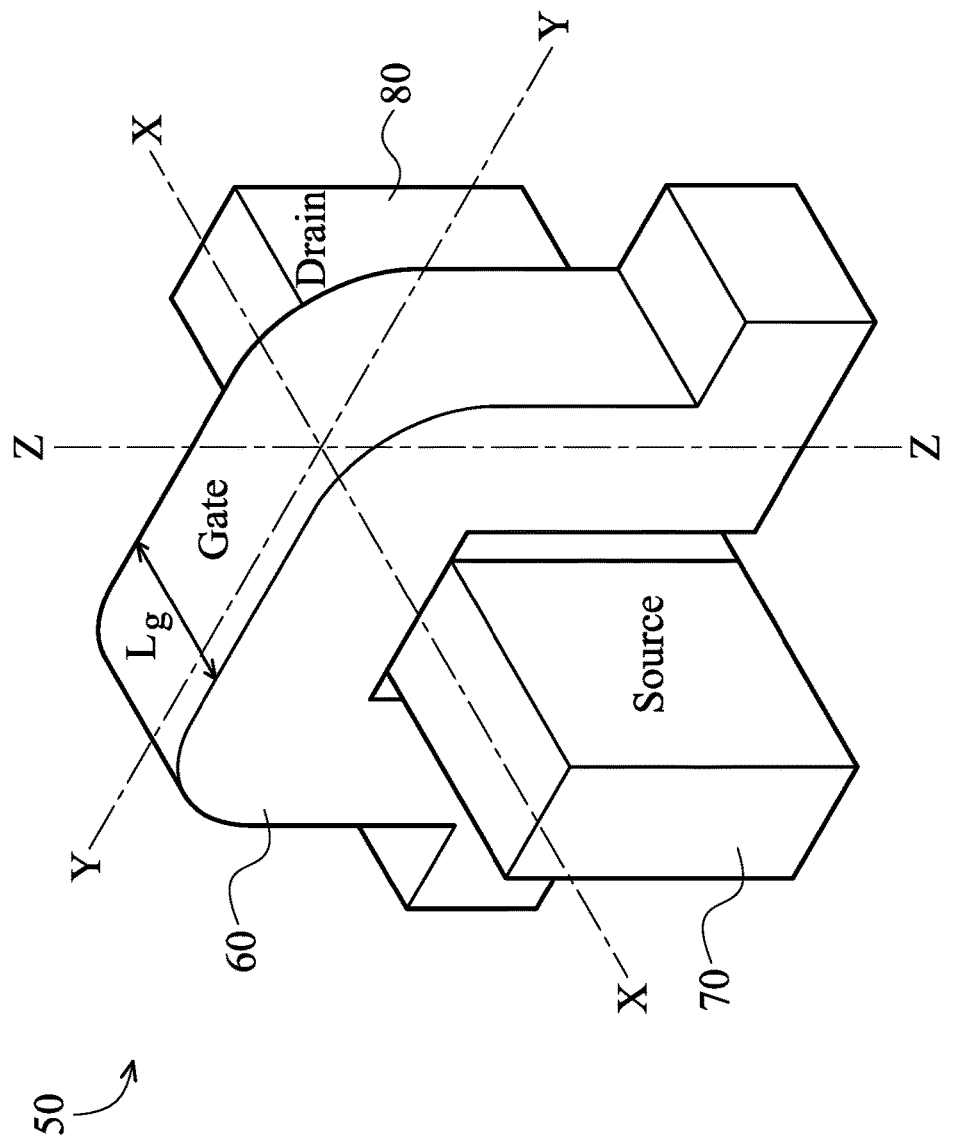
FIG. 1 is a perspective view of an example FinFET device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As semiconductor fabrication technologies continue to advance, traditional fabrication methods may encounter various problems. For example, the fabrication of semiconductor devices involves forming a resist-protection-oxide (RPO) layer on structures that protrude upwardly from a substrate or a layer. As device sizes continue to shrink with each technology generation, the RPO layer formed on adjacent protruding structures may "merge" with each other. In regions of the IC where the RPO layer needs to be eventually removed, this "merging" of the RPO layer between adjacent protruding structures may cause etching-related problems, since heavy etching may be needed to remove the "merged" RPO layer. For example, the RPO etching may cause a height differential between the shallow trench isolation (STI) between the protruding structures and outside the protruding structures. Another problem is that the RPO etching may over-etch and expose portions of the protruding structures. These problems may lead to a degradation of the electrical performance of the semiconductor device.

To overcome the problems discussed above, the present disclosure involves implementing an extra fabrication step to artificially "elevate" the RPO layer in regions of the IC where the RPO layer is to be removed later. The "elevated" RPO layer is easier to remove and does not require heavy etching, and as such the present disclosure will effectively prevent the problems discussed above that are caused by heavy etching needed to remove the "merged" RPO layer.

A FinFET fabrication is used as an example to illustrate some embodiments of the present disclosure, though it is understood that the present disclosure is not limited to FinFETs. A FinFET—or a fin-like field-effect transistor (FinFET) device—may be a complementary metal-oxide-semiconductor (CMOS) device including a P-type metal-oxide-semiconductor (PMOS) FinFET device and/or an N-type metal-oxide-semiconductor (NMOS) FinFET device. The use of FinFET devices has been gaining popularity in the semiconductor industry.

Referring to FIG. 1, a perspective view of an example FinFET device 50 is illustrated. The FinFET device 50 is a non-planar multi-gate transistor that is built on a substrate. A thin silicon "fin-like" structure (referred to as fin) forms the body of the FinFET device 50. A gate 60 of the FinFET device 50 is wrapped around this fin. Lg denotes a length (or width, depending on the perspective) of the gate 60. A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

FIGS. 2-9 are simplified diagrammatic fragmentary cross-sectional side views of a semiconductor conductor device 100 undergoing various fabrication steps according to embodiments of the present disclosure. In the illustrated embodiments of the present disclosure, the semiconductor device 100 includes a FinFET device. In other embodiments, however, the semiconductor device 100 may include a planar device (i.e., non-FinFET).

Figure 2:
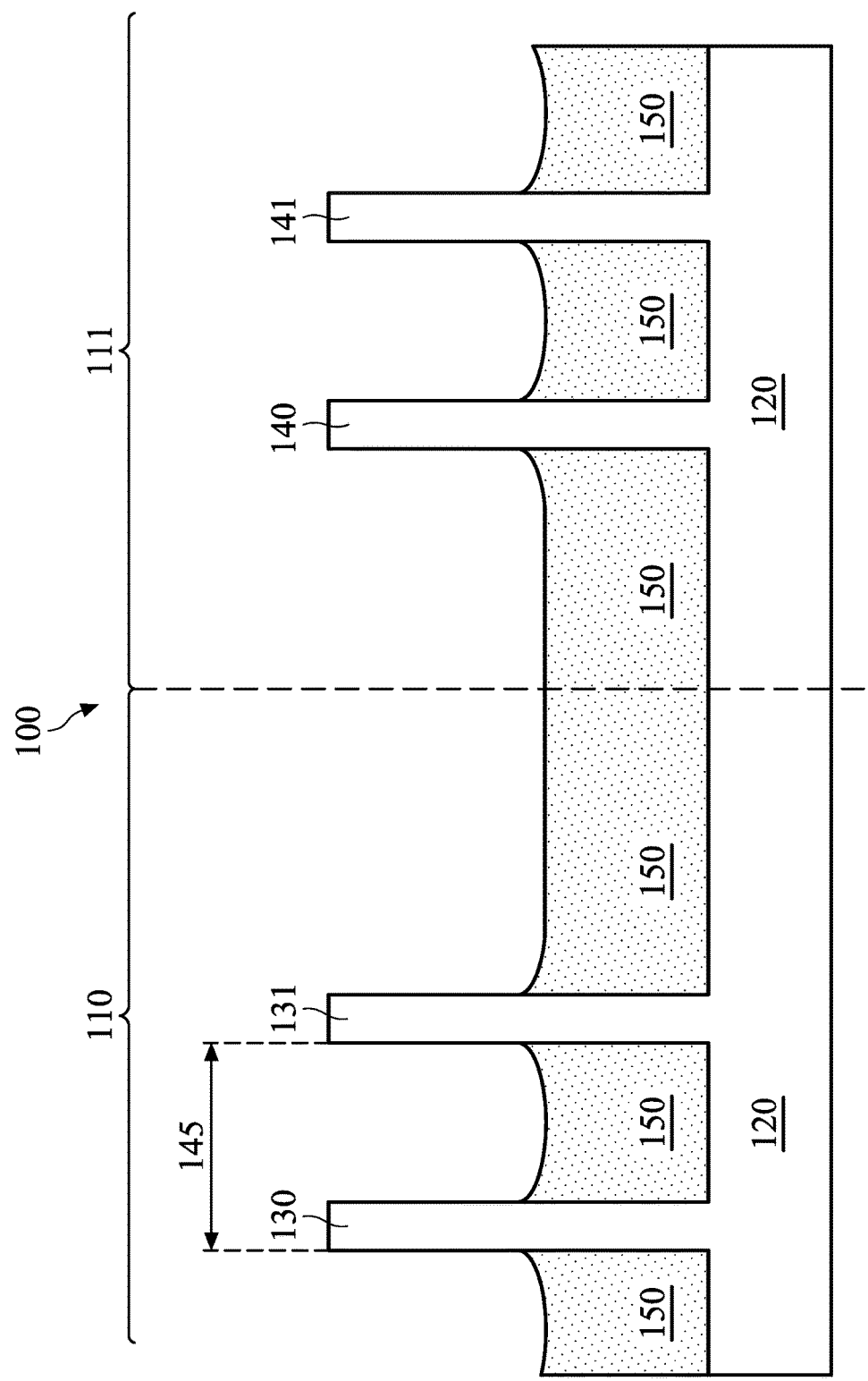
FIGS. 2-9 are different cross-sectional side views of a semiconductor device at different stages of fabrication according to various embodiments of the present disclosure.

In the embodiment illustrated in FIG. 2, the semiconductor device 100 includes a region 110 where an RPO layer should be removed so that silicides can be formed over the fins. The semiconductor device 100 also includes a region 111 where the RPO layer should remain (i.e., not removed) so that the RPO layer can prevent silicide formation on the fins. The region 110 may also be referred to as a "core" region, and the region 111 may also be referred to as a "frame" region. In some other embodiments, the region 110 is a PMOS region, and the region 111 is an NMOS region. In yet other embodiments, the region 110 is an NMOS region, and the region 111 is a PMOS region.

The regions 110 and 111 each include a semiconductor layer 120 is formed on a substrate (e.g., a dielectric substrate or a semiconductor substrate). In an embodiment, the semiconductor layer 120 includes a crystal silicon material. An implantation process may be performed to implant a plurality of dopant ions to the semiconductor layer 120. The dopant ions may include an n-type material in some embodiments, for example arsenic (As) or phosphorous (P), or they may include a p-type material in some other embodiments, for example boron (B), depending on whether an NMOS or a PMOS is needed. After the implantation process is performed, a doping concentration level in the semiconductor layer 120 is in a range from about $1 \times 10^{17}$ ions/cm$^3$ to about $5 \times 10^{19}$ ions/cm$^3$.

The region 110 includes fins 130 and 131, and the region 111 includes fins 140 and 141. The fins 130-131 and 140-141 are formed by patterning the semiconductor layer 120 via a lithography process, which include steps such as photoresist deposition, exposure, developing, baking, etc. (not necessarily performed in that order). A patterned photoresist formed may then be used to pattern the semiconductor layer 120 below to form the fins 130-131 and 140-141 by etching away portions of the layer 120 not protected by the patterned photoresist. In various embodiments, portions of the fins 130-131 or 140-141 may serve as the source, drain, or channel regions of the semiconductor device 100. It is understood that in some other embodiments, the fins 130-131 and 140-141 may not necessarily be the fins of FinFET devices. Instead, they may be some other type of protruding structure (i.e., protruding upwards from the layer below) that may appear in various suitable semiconductor fabrication processes.

As device sizes continue to shrink, a pitch 145 of the fins shrinks as well. For example, in some embodiments, the pitch 145 may be less than 10 nm, for example 5 nm. The small pitch 145 means that any layer formed thereon, if too thick (e.g., >about ½ of the pitch 145) may be in danger of merging with the layer formed on the adjacent fin. One such layer is the RPO layer, and the merging thereof presents fabrication issues, as discussed in greater detail below.

The fins 130-131 and 140-141 are isolated from one another by isolation structures 150. The isolation structures 150 may also be referred to as shallow trench isolation (STI) structures. In some embodiments, the isolation structures 150 contain a dielectric material such as silicon oxide or silicon nitride. The isolation structures 150 may be formed by depositing the dielectric material to fill the openings formed when the fins 130-131 and 140-141 are etched and then performing a polishing process (such as chemical mechanical polishing) to planarize the surface.

Figure 3:
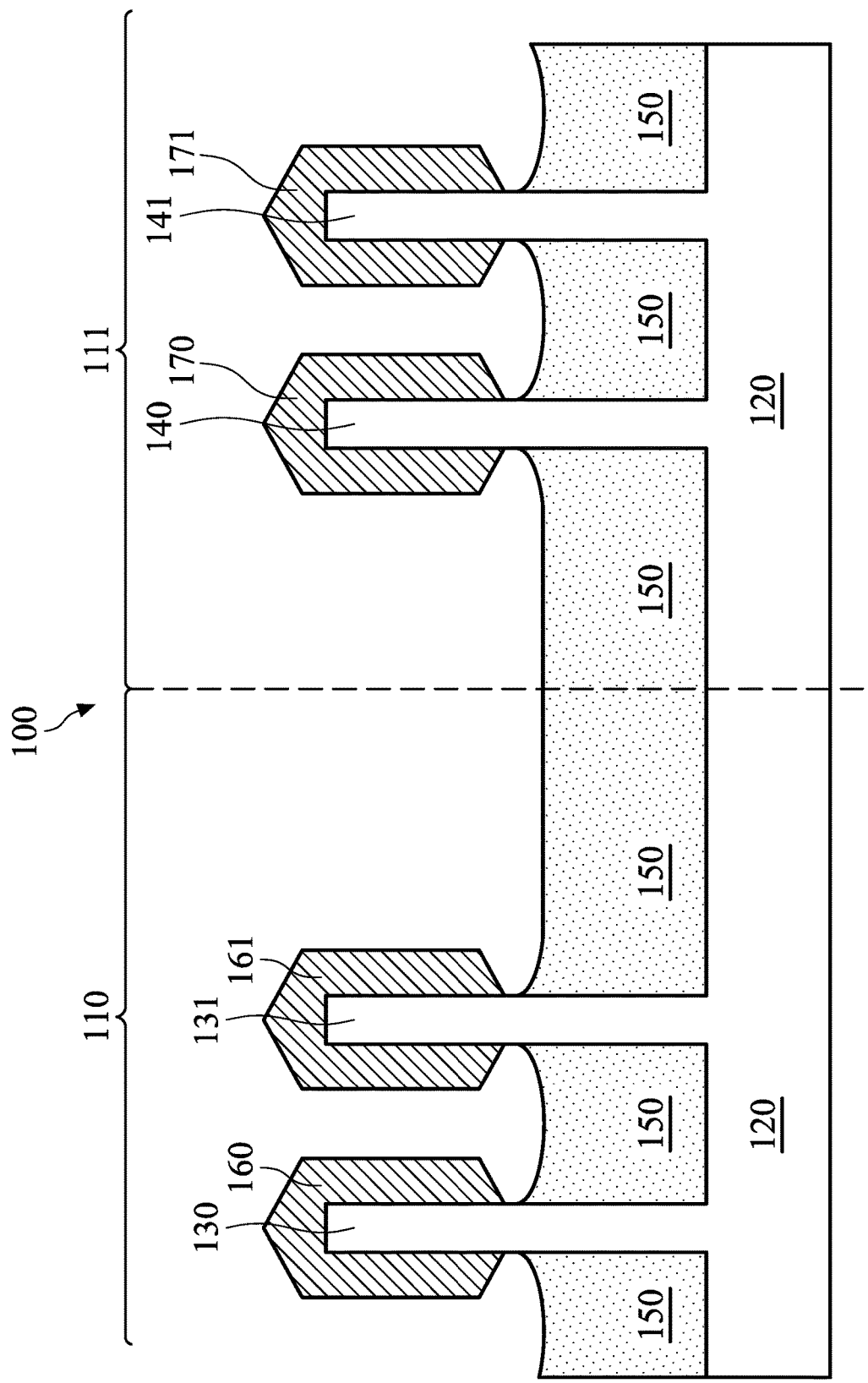

Referring now to FIG. 3, source/drain epi-layers 160-161 are formed on and around the fins 130-131, and source/drain epi-layers 170-171 are formed on and around the fins 140-141. The source/drain epi-layers 160-161 and 170-171 are formed by an epitaxial growth process. In other words, the source/drain epi-layers 160-161 and 170-171 are epitaxially grown on the exposed surfaces of the fins 130-131 and 140-141. In some embodiments, the source/drain epi-layers 160-161 and 170-171 contain silicon germanium (SiGe). In other embodiments, the source/drain epi-layers 160-161 and 170-171 contain silicon carbide (SiC), or some other suitable material. As discussed above, it is intended to have silicide formed in the region 110 (i.e., silicide is formed on the source/drain epi-layers 160-161), whereas no silicide should be formed in the region 111 (i.e., no silicide should be formed on the source/drain epi-layers 170-171).

Figure 4:
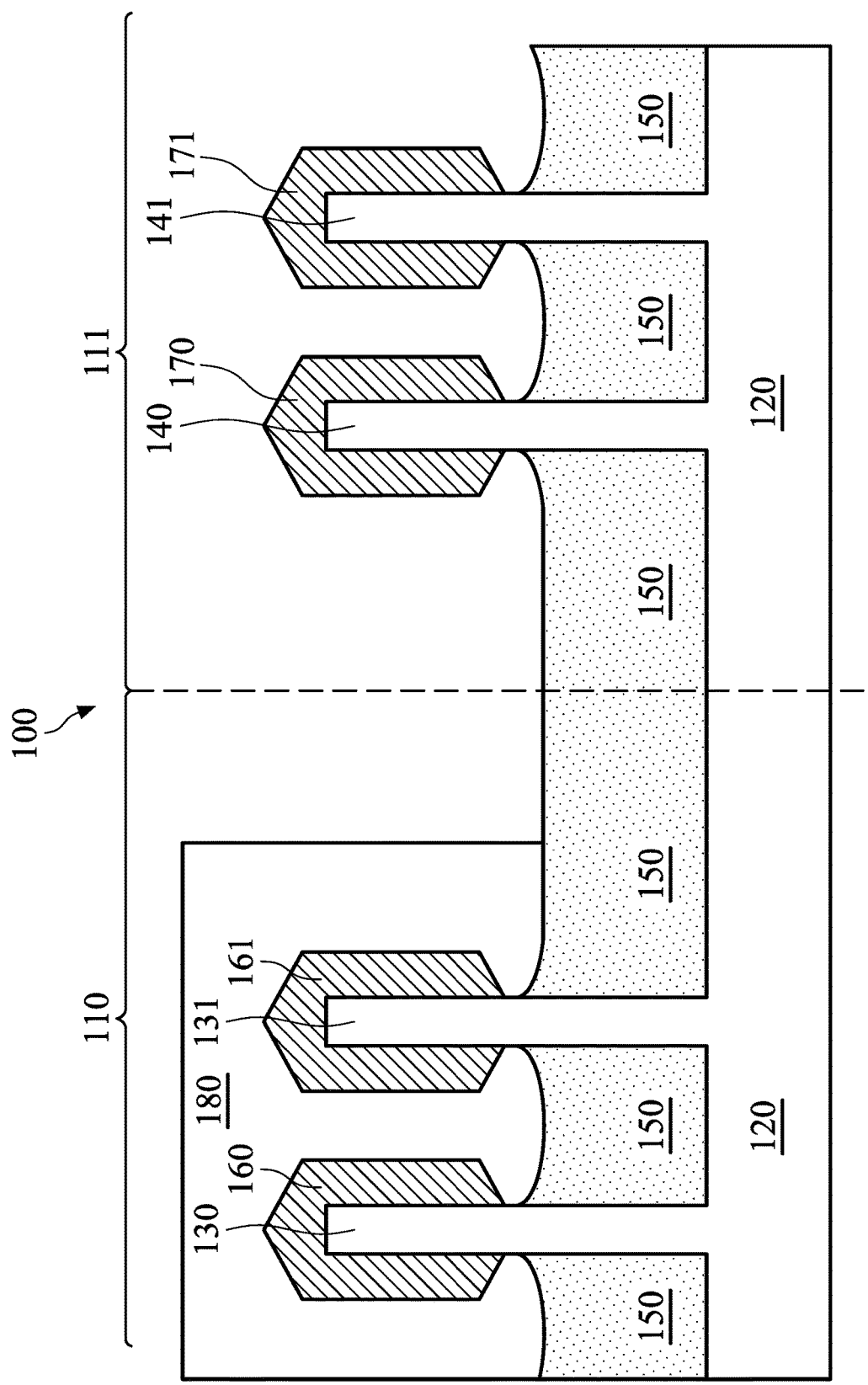

Referring now to FIG. 4, a photoresist layer 180 is formed in at least a portion of the region 110 of the semiconductor device 100. The photoresist layer 180 may be formed by a spin-coating process and includes a positive photoresist. The photoresist layer 180 covers the source/drain epi-layers 160-161 as well as portions of the isolation structures 150 that are exposed. In some embodiments, the photoresist layer 180 is formed to have a thickness in a range from about 200 nanometers (nm) to about 500 nm. The formation of the photoresist layer 180 in the region 110 is missing in conventional fabrication. The photoresist layer 180 is implemented in the present disclosure to "elevate" a subsequently formed RPO layer and to prevent that RPO layer from being merged, as discussed below. The photoresist layer 180 may also be referred to as a pre-RPO photo.

Figure 5:
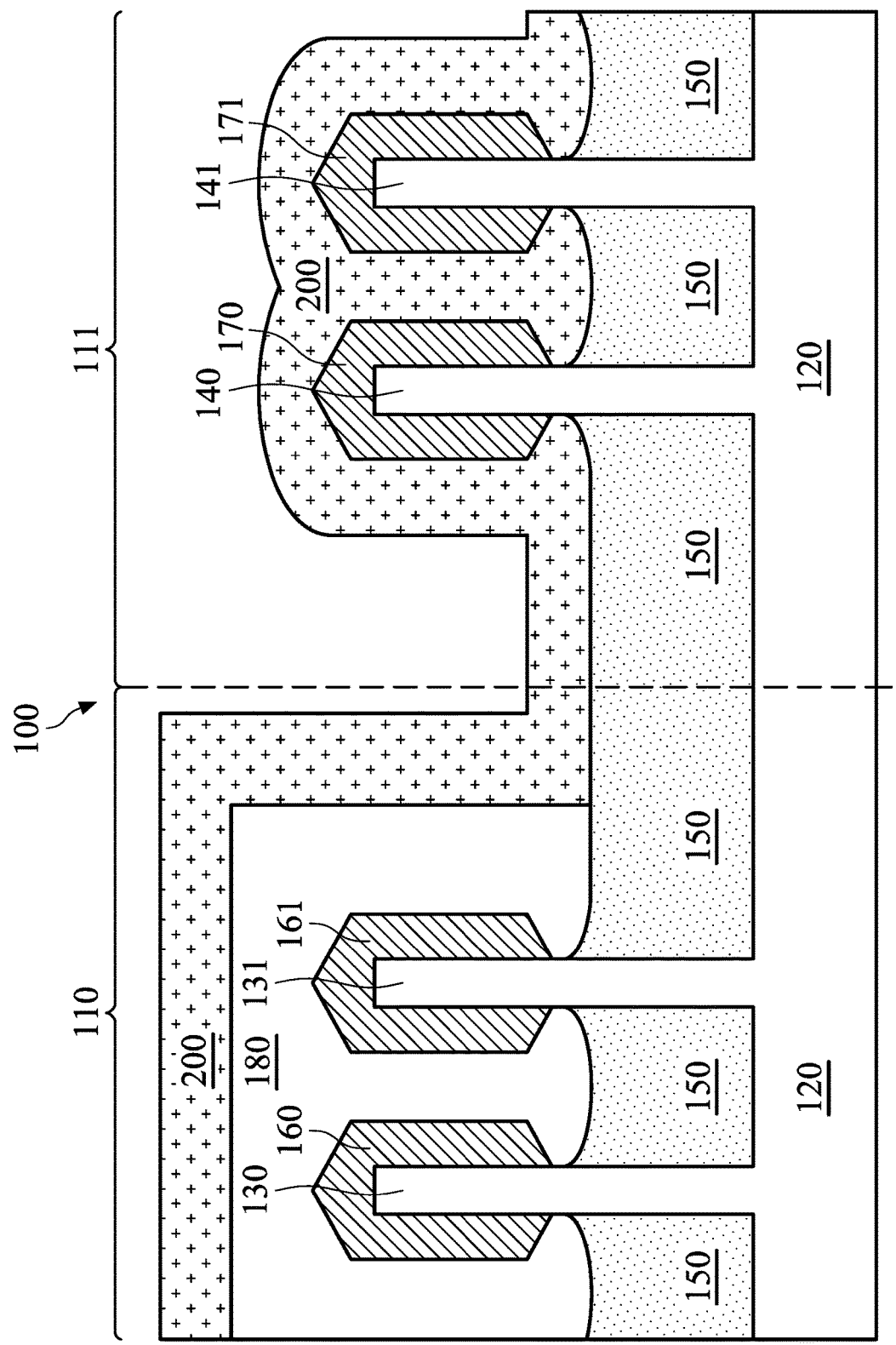

Referring now to FIG. 5, an RPO layer 200 is formed in both regions 110 and 111 of the semiconductor device 100. The RPO layer 200 is formed on the photoresist layer 180 and over the source/drain epi-layers 170-171, as well as over portions of the isolation structures 150. The RPO layer 200 may be formed to contain a dielectric material such as silicon oxide, silicon nitride, silicon carbon nitride, silicon oxynitride, silicon carbide, or silicon oxycarbide, or combinations thereof. The RPO layer 200 is formed to protect the source/drain epi-layers 170-171 from undergoing silicidation in a subsequent process.

The RPO layer 200 may be formed by various deposition methods such as atomic layer deposition (ALD), chemical vapor deposition (CVD), plasma enhanced chemical vapor deposition (PECVD), or by a furnace. In some embodiments, the deposition process used to form the RPO layer 200 is a low temperature deposition process to avoid damaging the photoresist layer 180. In more detail, photoresist may carbonize at temperatures about 200 degrees Celsius, and carbonized photoresist is difficult to remove. Conventional processes used to form dielectric layers often have process temperatures greater than 400 degrees Celsius, and thus if the RPO layer 200 had been formed over the photoresist layer 180 using a conventional dielectric deposition process, the photoresist layer 180 would have been damaged. Here, the process temperature used to form the RPO layer 200 is less than about 200 degrees Celsius. In some embodiments, the process temperature used to form the RPO layer 200 is in a range from about 50 degrees Celsius to about 70 degrees Celsius. These low process temperature ranges allow the RPO layer 200 to be formed over the photoresist layer 180 without damaging the photoresist layer 180 (e.g., without causing the photoresist layer 180 to carbonize).

In some embodiments, the RPO layer 200 is formed to have a thickness in a range from about 2 nm to about 10 nm. This range of RPO layer thickness allows the RPO layer to effectively protect the layers below from undergoing silicidation. In the embodiments of the present disclosure, the pitch 145 of the fins is less than about twice (2×) the thickness of the RPO layer 200. In other embodiments, the thickness of the RPO layer 200 is greater than ½ of the gap or distance separating the source/drain epi-layers 160 and 161. For these reasons, the merging of the RPO layer 200 would have occurred if the RPO layer 200 is allowed to be formed on the epi-layers 160-161 directly.

As is clearly shown in FIG. 5, due to the presence of the photoresist layer 180, a portion of the RPO layer 200 formed in the region 110 is "elevated" and is formed above the source/drain epi-layers 160-161, rather than being formed directly on the source/drain epi-layers 160-161. Had the RPO layer 200 been formed directly on the source/drain epi-layers 160-161, then due to the small dimensions between the fins 130-131 (and thus between the source/drain epi-layers 160-161), the RPO layer 200 formed on the source/drain epi-layer 160 would have likely merged with the RPO layer 200 formed on the source/drain epi-layer 161. In other words, it would have been as if the source/drain epi-layers 160 and 161 (and their respective fins 130 and 131) are enclosed or surrounded by a single thick RPO layer, similar to how the source/drain epi-layers 170-171 are enclosed or surrounded by the thick RPO layer 200 in the region 111. The purpose of the RPO layer 200 is to protect the source/drain epi-layers 170-171 from undergoing silicidation, and therefore the presence of the RPO layer 200 in the region 111 is desired. However, the source/drain epi-layers 160-161 in the region 110 are supposed to undergo silicidation, and therefore the presence of a thick RPO layer 200 on their surfaces is undesired, and as such, any RPO layer 200 formed on the source/drain epi-layers 160-161 would have needed to be removed.

Unfortunately, the merging of the RPO layers would have made their removal difficult. Heavy etching may need to be used to carry out the RPO layer removal in the region 110, and that would have caused several problems. One problem would have been an uneven etching of the isolation structures. For example, the portion of the isolation structure 150 located to the right of the fin 131 would have been etched significantly greater than the portion of the isolation structure 150 located between the fins 130-131. This unevenness of the heights of the isolation structures 150 would lead to poor electrical performance of the semiconductor device 100. Another problem is that some portions of the fins 130-131 would have been exposed by the over-etching of the isolation structures. The exposure of the fins 130-131 would have also led to poor electrical performance issues such as short channel effect, which may be caused by silicide forming on the exposed fins 130-131.

The present disclosure obviates these issues by artificially "elevating" the RPO layer 200 (since it is formed over the photoresist layer 180) so that the RPO layer 200 is not formed directly on the source/drain epi-layers 160-161. Consequently, no merging of the RPO layer 200 would occur, and the removal of the RPO layer 200 in the region 110 will be easy (i.e., no heavy etching is needed) in a subsequent process.

Figure 6:
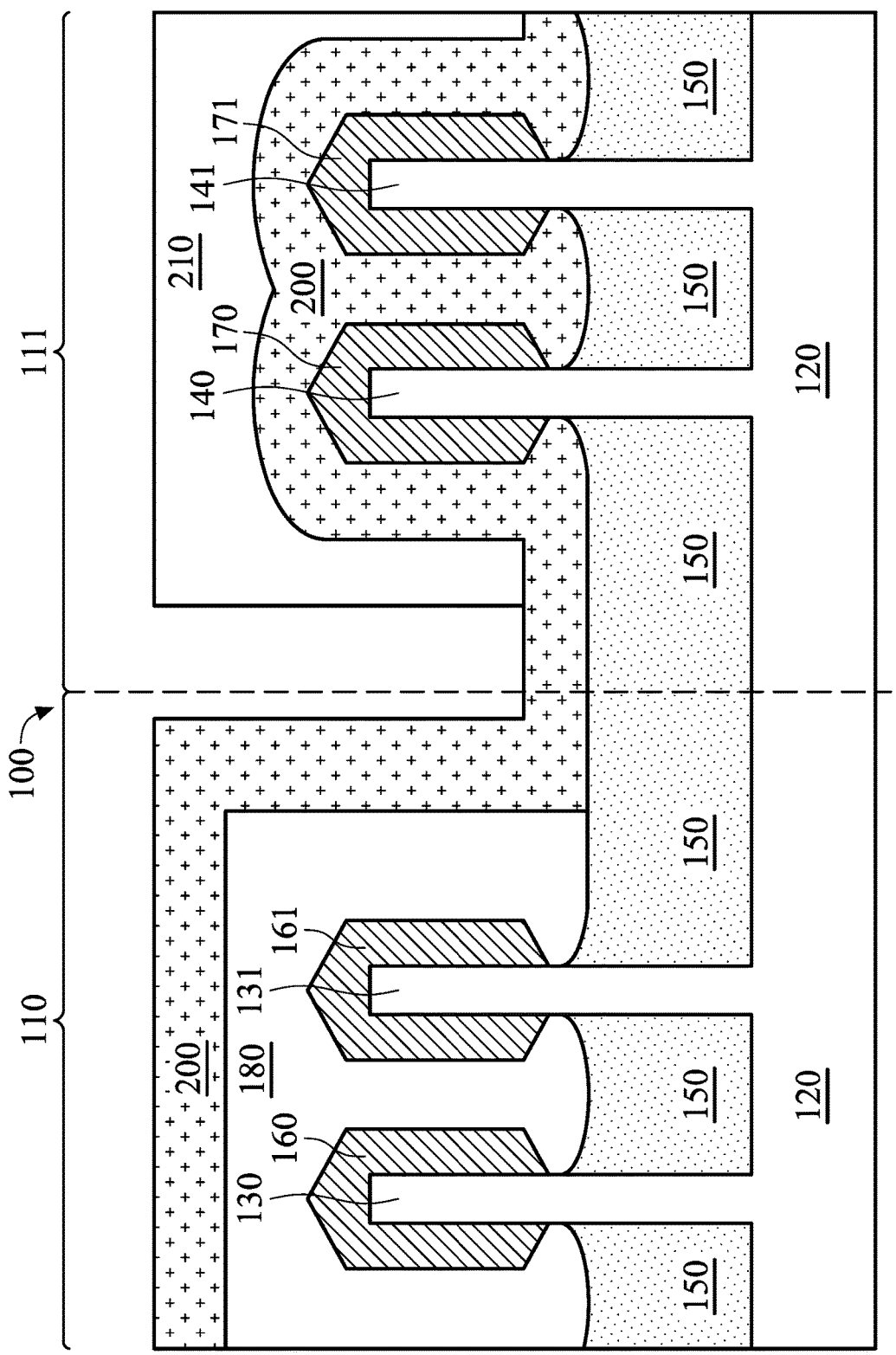

Referring now to FIG. 6, a photoresist layer 210 is formed in the region 111, but not in the region 110. The photoresist layer 210 includes a positive photoresist and may be formed using a spin coating process. The photoresist layer 210 covers the RPO layer 200 that is formed on the source/drain epi-layers 170-171 in the region 111. The photoresist layer 210 protects the layers therebelow in a subsequent etching process used to remove the RPO layer 200 in the region 110. The photoresist layer 210 is formed to have a thickness in a range from about 200 nm to about 500 nm. The thickness range is configured so that the photoresist layer 210 can adequately protect the layers therebelow in the etching process.

Figure 7:
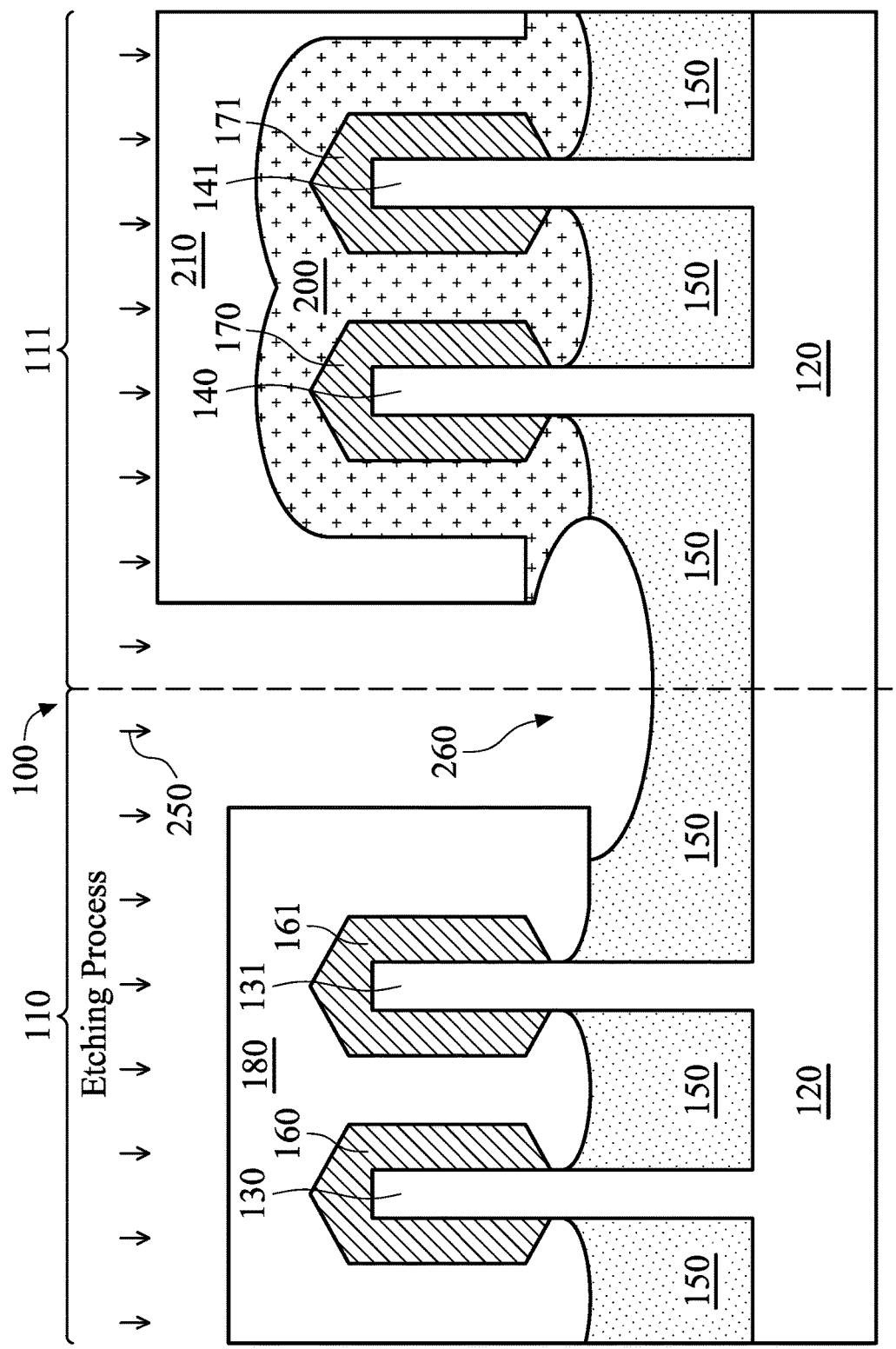

Referring now to FIG. 7, an etching process 250 is performed. In some embodiments, the etching process 250 includes a dry etching process. In some other embodiments, the etching process 250 includes a wet etching process, in which hydrofluoric acid or diluted hydrofluoric acid is used as the etchant. In yet other embodiments, the etching process 250 includes a combination of dry etching and wet etching. The etching process 250 is configured to remove about 3-15 nm of RPO material, and thus the etching process 250 etches away portions of the RPO layer 200 that are not protected by the photoresist layer 210. Again, since the RPO layer 200 in the region 110 is elevated above the photoresist layer 180 (and thus cannot merge together between adjacent fins 130-131), the removal of the RPO layer 200 is easier and does not require heavy etching. Consequently, the present disclosure is free of the problems that were caused by heavy etching that plagued conventional devices.

After the etching process 250 is performed, the RPO layer 200 in the region 110 is removed, and even some portions of the RPO layer 200 in the region 111 are removed too. The etching process 250 forms an opening (or recess) 260. The recess 260 extends into the isolation structure 150 between the photoresist layers 180 and 210. The recess 260 also protrudes laterally underneath a portion of the photoresist layer 180 and a portion of the photoresist layer 210. This recess 260 forms a "ring-like" trench that encircles the photoresist layer 210 (and the RPO layer 200 below) in a top view. This "ring-like" trench is one of the unique signatures of the semiconductor device 100 fabricated according to the embodiments of the present disclosure.

Figure 8:
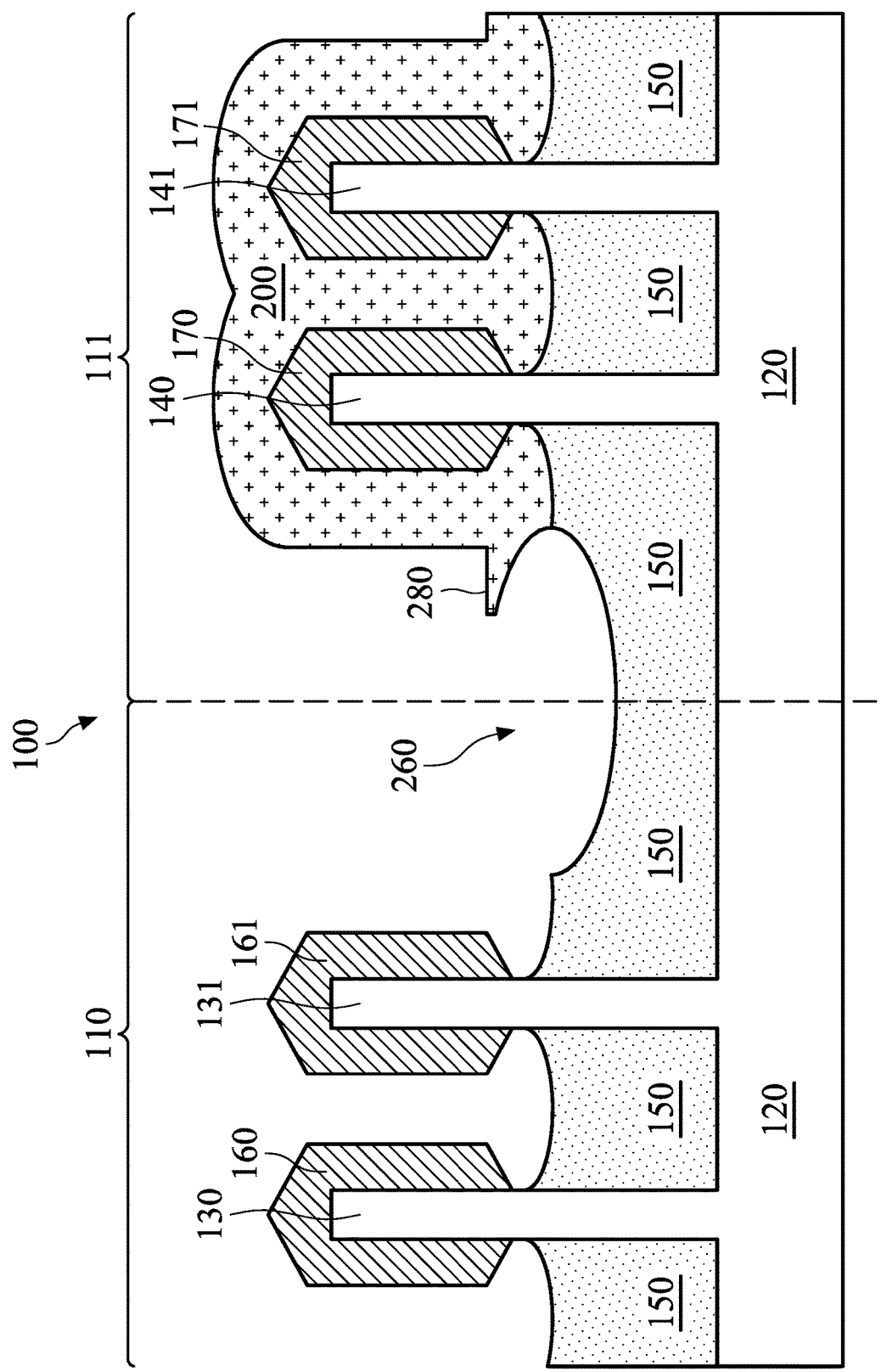

Referring now to FIG. 8, the photoresist layers 180 and 210 are both removed in a photoresist removal process, for example by an photoresist ashing or stripping process. The removal of the photoresist layers 180 and 210 exposes the source/drain epi-layers 160-161 in the region 110 and exposes the RPO layer 200 in the region 111. The upper surfaces of the isolation structures 150 that had been previously covered up by the photoresist layers 180 and 210 are also now exposed. Note that the RPO layer 200 still remains in the region 111.

Figure 9:
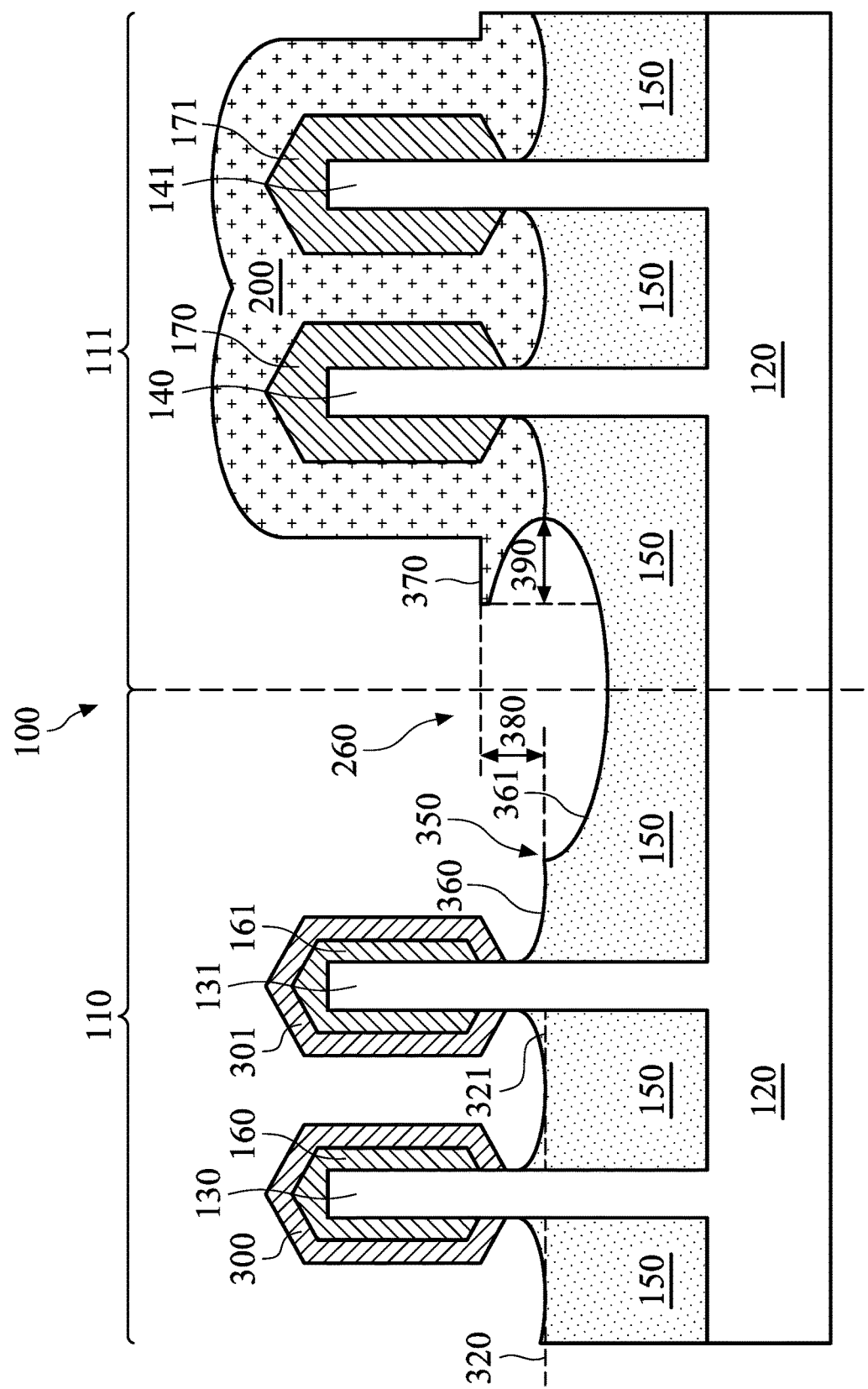

Referring now to FIG. 9, a silicidation process is performed to form silicide layers 300-301. The silicide layers 300-301 are formed by transforming outer portions of the source/drain epi-layers 160-161 into silicides, respectively. In various embodiments, the silicide layers 300-301 contain nickel silicide (NiSi), nickel germano-silicide (NiSiGe), titanium silicide (TiSi), or titanium germano-silicide (TiSiGe). The silicide layers 300-301 have enhanced conductivity compared to the source/drain epi-layers 160-161. Meanwhile, the RPO layer 200 in the region 111 prevents the source/drain epi-layers 170-171 from forming silicides. In some embodiments, the RPO layer 200 in the region 111 has a thickness range between about 2 nm and about 10 nm so as to effectively protect the source/drain epi-layers 170-171 from undergoing silicidation.

The semiconductor device 100 fabricated according to the present disclosure has several unique physical device characteristics compared to conventional devices. For example, the isolation structure 150 disposed to the left of the fin 130 may be referred to as an outer-fin STI, and it has a height 320, for example a height measured from a lowest point of its upper surface. The isolation structure 150 disposed between the fins 130-131 may be referred to as an inner-fin STI, and it has a height 321, for example a height measured from a lowest point of its upper surface. As a result of the fabrication processes performed herein, a difference between the height 320 and the height 321 is small, which may be less than about 5 nm in some embodiments. In comparison, the height difference between the inner-fin STI and the outer-fin STI in conventional devices would be substantially larger, for example it may be at least 10 nm and may be as large as 65 nm. The larger height difference between the inner-fin STI and the outer-fin STI in conventional devices is at least in part attributed to the merge RPO layer between the fins 130-131, which as discussed above would require heavy etching to remove. The heavy etching causes the outer-fin STI to be etched more deeply than the inner-fin STI, since the etching would have to etch away the merged RPO layer between the adjacent fins 130-131 before reaching the inner-fin STI. The imbalance between the inner-fin and outer-fin STI heights would lead to poor electrical performance for conventional devices. This is not a problem for the present disclosure since the inner-fin and outer-fin STI heights are substantially the same or within a small difference of each other, which leads to improved electrical performance.

As another example, the semiconductor device 100 has a unique two-step STI profile. In more detail, the isolation structure 150 in the region 110 (to the right of the fin 131) has a protruding "bump" 350 before recessing further downward. Stated differently, the upper surface of the isolation structure 150 has a profile that resembles two distinct "steps", where a taller "step" 360 is located adjacent to the fin 131, and a lower "step" 361 is located farther away from the fin 131 and closer to the region 111. This unique two-step profile is also a byproduct of the unique fabrication process flow discussed above. As shown in FIG. 7, the photoresist layer 180 protects a portion of the isolation structure 150 therebelow from being etched during the etching process 250, and the upper surface of the unetched isolation structure 150 to the right of the fin 131 ends up becoming the taller "step" 360 as shown in FIG. 9. The upper surface of the isolation structure 150 that is etched by the etching process 250 ends up becoming the lower "step" 361 as shown in FIG. 9. The conventional devices lack this two-step STI profile (e.g., the bump 350 would be missing), since there would have been no photoresist layer 180 to protect the portions of the isolation structure 150 from being etched.

As yet another example, the semiconductor device 100 also has an outwardly protruding RPO segment 370 as shown in FIG. 9. There is a noticeable height difference 380 between the taller "step" 360 and the protruding RPO segment 370. In some embodiments, the height difference 380 is substantially equal to the thickness of the RPO layer 200 (since the height difference 380 is a result of the removal of the RPO layer 200). Thus, in embodiments where the RPO layer 200 is in a range from about 2 nm to about 10 nm, the height difference 380 is also in a range from about 2 nm to about 10 nm. Furthermore, the etching process 250 performed in FIG. 7 to etch the RPO layer 200 also leads to lateral etching of the RPO layer 200 in the region 111, such that the protruding RPO segment 370 protrudes laterally by a distance 390 (also referred to as a lateral etch distance 390). In some embodiments, the distance 390 is in a range from about 2 nm to about 10 nm.

Figure 10:
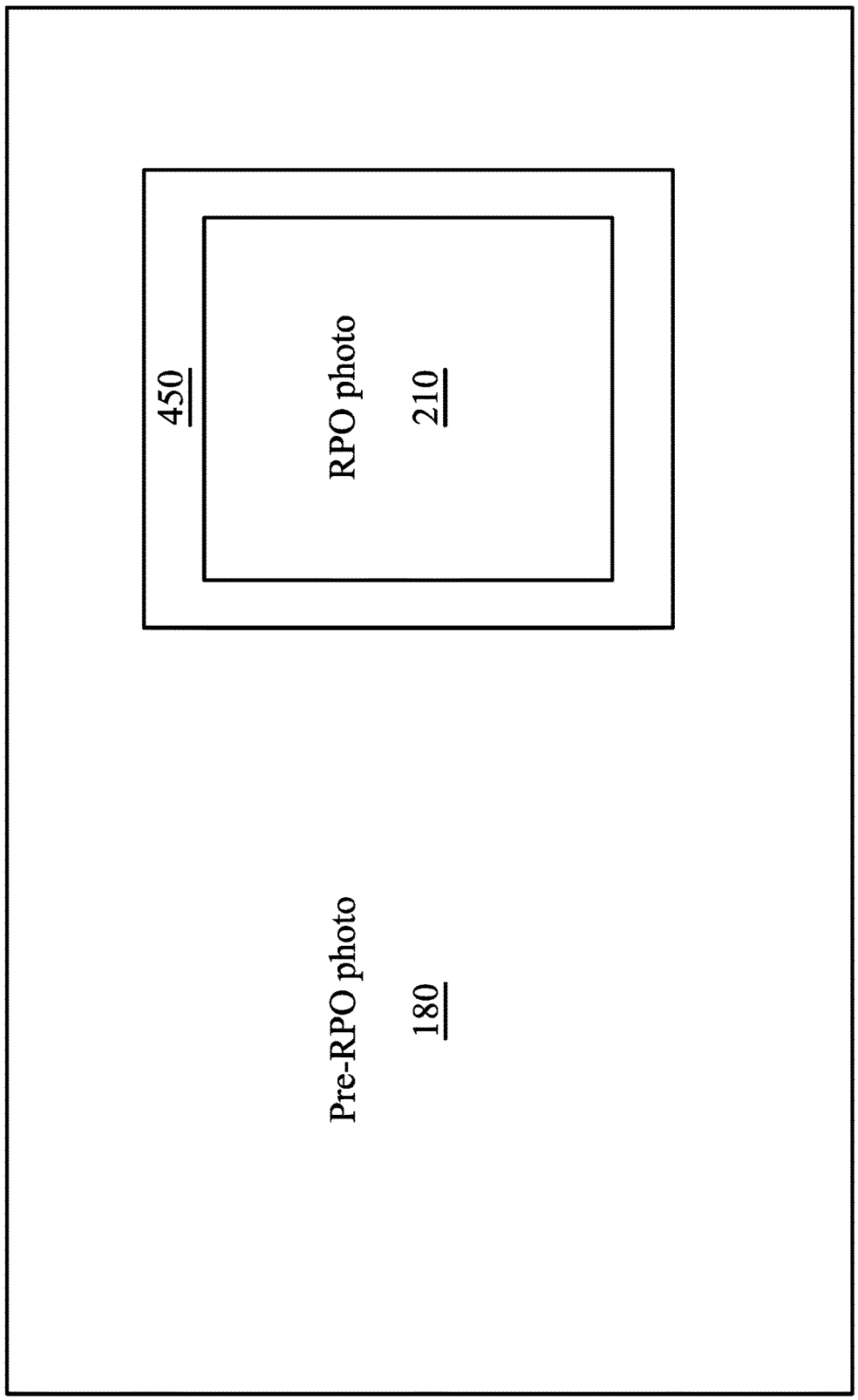
FIG. 10 is a top view of a semiconductor device according to various embodiments of the present disclosure.

As another example, the semiconductor device 100 has a ring-type STI trench (i.e., the recess 260 discussed above) formed to circumferentially surround the RPO layer 200. This trench can also be seen in a top view. For example, referring to FIG. 10, a top view of the semiconductor device 100 is illustrated. The top view in FIG. 10 illustrates the photoresist 180 (also referred to as pre-RPO photo) and the photoresist 210 (also referred to as RPO photo). It is also understood that top view of FIG. 10 also corresponds to a composite image of the different photomasks corresponding to the photoresist 180 and the photoresist 210. Regardless, it can be seen clearly that a gap or ring 450 separates the pre-RPO photo 180 and the RPO photo 210. The gap 450 shown in FIG. 10 coincides with the recess 260 in FIGS. 7-9. In some embodiments, the gap 450 has a width between about 15 nm and about 30 nm. This gap/ring 450 circumferentially surrounds the RPO photo 210 in the top view. The gap/ring 450 may have a narrower or wider lateral dimension than the ring-type STI trench 260 in the cross-sectional view of FIG. 9, but they otherwise correspond to each other. This gap/ring 450 (in the top view) and the ring-style STI trench 260 (in the cross-sectional view) that encircles the RPO photoresist 210 (or the RPO layer 200) in the region 111 in the top view is also a unique physical device characteristic of the semiconductor device 100 of the present disclosure.

Although the discussions above are carried out using a FinFET device as an example of the semiconductor device 100 for implementing the various aspects of the present disclosure, it is understood that a planar device (non-FinFET) may also be used to implement the various aspects of the present disclosure. In addition, it is understood that a gate placement process may also be applied to form the gates of the semiconductor device 100, as discussed in detail in U.S. patent application Ser. No. 13/440,848, filed on Apr. 5, 2012, entitled "Cost-effective gate replacement process" to Zhu et al., which is issued as U.S. Pat. No. 8,753,931 on Jun. 17, 2014, the disclosure of which is hereby incorporated by reference in its entirety.

FIG. 11 is a flowchart illustrating a method 800 of fabricating a semiconductor device according to embodiments of the present disclosure. The method 800 includes a step 810 of providing a semiconductor device having a first region and a second region. The first region has a first protruding structure and a second protruding structure. The second region has a third protruding structure and a fourth protruding structure. In some embodiments, the first, second, third, and fourth protruding structures are fins of a FinFET device.

The method 800 includes a step 820 of forming first, second, third, and fourth epi-layers on the first, second, third, and fourth protruding structures, respectively.

The method 800 includes a step 830 of covering the first and second epi-layers with a first photoresist layer while leaving the third and fourth epi-layers exposed.

The method 800 includes a step 840 of forming a dielectric layer over the first photoresist layer and over the third and fourth epi-layers. In some embodiments, the dielectric layer is formed by a low temperature deposition process. The low temperature is below a temperature that causes photoresist to carbonize. In some embodiments, the low temperature deposition process is in a temperature range between about 50 degrees Celsius and about 70 degrees Celsius.

The method 800 includes a step 850 of covering a portion of the dielectric layer with a second photoresist layer. The portion of the dielectric layer is formed over the third and fourth epi-layers. The first and second photoresist layers are formed such that a gap exists between the first and second photoresist layers.

The method 800 includes a step 860 of etching portions of the dielectric layer not protected by the first and second photoresist layers. In some embodiments, the etching comprises etching a trench that circumferentially surrounds the second photoresist layer in a top view.

The method 800 includes a step 870 of removing the first and second photoresist layers.

The method 800 includes a step 880 of forming silicides on the first and second epi-layers while the third and fourth epi-layers are protected by the dielectric layer.

It is understood that additional steps may be performed to complete the fabrication of the semiconductor device 100. However, for reasons of simplicity these additional steps are not discussed herein in detail.

The present disclosure offers advantages over conventional semiconductor devices and the fabrication thereof. It is understood, however, that other embodiments may offer additional advantages, and not all advantages are necessarily disclosed herein, and that no particular advantage is required for all embodiments. One advantage is that by implementing extra fabrication step of forming a pre-RPO photoresist layer to elevate the RPO layer in the region to be silicided, the present disclosure avoids the RPO merging issues associated with conventional fabrication. As a result, the removal of the elevated RPO layer is easy and does not require heavy etching. This prevents the various issues caused by heavy etching in conventional devices, such as uneven STI loss or short channel effect due to over-exposure of the fins. Therefore, device performance is improved. Another advantage is that the various aspects of the present disclosure are easy to implement and do not significantly increase fabrication costs. Yet another advantage of the present disclosure is that the steps discussed herein are compatible with existing fabrication process flow.

One aspect of the present disclosure involves a semiconductor device. The semiconductor device includes a first protruding structure and a second protruding structure each protruding out of an isolation structure. The first and second protruding structures are disposed in a first region of the semiconductor device. A first epi-layer and a second epi-layer are formed on the first and second protruding structures. Respectively. The first and second epi-layers each have a silicided surface. A third protruding structure and a fourth protruding structure each protrude out of the isolation structure. The third and fourth protruding structures are disposed in a second region of the semiconductor device. A third epi-layer and a fourth epi-layer are formed on the third and fourth protruding structures, respectively. The third and fourth epi-layers are free of having a silicided surface. A recess is formed in the isolation structure. The recess circumferentially surrounds the third and fourth epi-layers in a top view.

Another aspect of the present disclosure involves a semiconductor device. A first fin and a second fin each protrude out of a shallow trench isolation (STI). The first and second fins are located in a first region of a FinFET. A first epi-layer and a second epi-layer are formed on the first and second fins, respectively. The first and second epi-layers each have a silicided surface. A third fin and a fourth fin each protrude out of the STI. The third and fourth fins are located in a second region of the FinFET. A third epi-layer and a fourth epi-layer are formed on the third and fourth fins, respectively. The third and fourth epi-layers are free of having a silicided surface. A resist-protection oxide (RPO) layer is formed on the third and fourth epi-layers but not on the first and second epi-layers. A trench is formed in the STI. The trench encircles the RPO layer in a top view.

One aspect of the present disclosure involves a method of fabricating a semiconductor device. A semiconductor device having a first region and a second region is provided. The first region has a first protruding structure and a second protruding structure. The second region has a third protruding structure and a fourth protruding structure. First, second, third, and fourth epi-layers are formed on the first, second, third, and fourth protruding structures, respectively. The first and second epi-layers are covered with a first photoresist layer while leaving the third and fourth epi-layers exposed. A dielectric layer is formed over the first photoresist layer and over the third and fourth epi-layers. A portion of the dielectric layer is covered with a second photoresist layer. The portion of the dielectric layer is formed over the third and fourth epi-layers. Portions of the dielectric layer not protected by the first and second photoresist layers are etched. The first and second photoresist layers are removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating semiconductor device, comprising:
    epitaxially growing a first source/drain on a first fin structure and a second source/drain on a second fin structure;
    forming a first layer over the first source/drain but not over the second source/drain;
    forming a dielectric layer over the first layer and over the second source/drain; and
    removing a first segment of the dielectric layer but not a second segment of the dielectric layer, wherein the first segment is disposed over the first layer, and wherein the second segment is disposed over the second source/drain.

2. The method of claim 1, wherein an upper surface of the first segment of the dielectric layer is formed to have a higher elevation than an upper surface of the second segment of the dielectric layer.

3. The method of claim 1, further comprising:
removing the first layer after the removing of the first segment, thereby exposing the first source/drain, wherein the second source/drain is covered by the second segment of the dielectric layer after the first layer is removed; and
forming a silicide on the first source/drain but not on the second source/drain.

4. The method of claim 1, wherein the removing of the first segment comprises performing an etching process, wherein the etching process etches a recess in an isolation structure that surrounds lower portions of the first and second fin structures.

5. The method of claim 4, wherein the recess encircles the second source/drain in a top view.

6. The method of claim 1, wherein the forming of the first layer comprises forming a first photoresist as the first layer.

7. The method of claim 6, further comprising:
after the forming of the dielectric layer but before the removing of the first segment, forming a second photoresist over the second segment of the dielectric layer, wherein the second photoresist protects the second segment from being removed during the removing of the first segment; and
after the removing of the first segment, removing the first photoresist and the second photoresist simultaneously.

8. The method of claim 1, wherein one of the first and second source/drains is a source/drain of an NMOS, while another one of the first and second source/drains is a source/drain of a PMOS.

9. The method of claim 1, wherein the forming of the dielectric layer comprises performing a deposition process to deposit the dielectric layer, wherein the deposition process is performed with a process temperature that is less than a first temperature, and wherein a photoresist material carbonizes at temperatures above the first temperature.

10. The method of claim 1, wherein:
the epitaxially growing further comprises growing a third source/drain on a third fin structure, the third fin structure being located adjacent to the first fin structure; and
the first layer is formed over the first source/drain and over the third source/drain.

11. The method of claim 10, wherein:
the first source/drain and the third source/drain are separated by a first distance; and
the dielectric layer is formed to have a thickness that is greater than ½ of the first distance.

12. A method of fabricating semiconductor device, comprising:
epitaxially growing a first epi-layer on a first fin structure and a second epi-layer on a second fin structure;
forming a first photoresist layer over the first epi-layer but not over the second epi-layer;
forming a dielectric layer over the first photoresist layer and over the second epi-layer, wherein a first segment of the dielectric layer is formed over the first photoresist layer, and wherein a second segment of the dielectric layer is formed over the second epi-layer;
forming a second photoresist layer over the second segment of the dielectric layer;
performing an etching process to remove the first segment of the dielectric layer, wherein the second photoresist layer protects the second segment of the dielectric layer from being etched;
removing the first photoresist layer and the second photoresist layer; and
forming a silicide on the first epi-layer, wherein the second segment of the dielectric layer prevents silicide from being formed on the second epi-layer.

13. The method of claim 12, wherein a first segment of the dielectric layer formed over the first photoresist layer has a greater height than a second segment of the dielectric layer formed over the second epi-layer.

14. The method of claim 12, wherein the forming of the dielectric layer comprises performing a deposition process with a process temperature lower than about 200 degrees Celsius.

15. A method of fabricating semiconductor device, comprising:
providing a semiconductor device having a first region and a second region, the first region having a first protruding structure and a second protruding structure, and the second region having a third protruding structure and a fourth protruding structure;
forming first, second, third, and fourth epi-layers on the first, second, third, and fourth protruding structures, respectively;
covering the first and second epi-layers with a first photoresist layer while leaving the third and fourth epi-layers exposed;
forming a dielectric layer over the first photoresist layer and over the third and fourth epi-layers;
covering a portion of the dielectric layer with a second photoresist layer, the portion of the dielectric layer being formed over the third and fourth epi-layers;
etching portions of the dielectric layer not protected by the first and second photoresist layers; and
removing the first and second photoresist layers.

16. The method of claim 15, further comprising: forming silicides on the first and second epi-layers while the third and fourth epi-layers are protected by the dielectric layer.

17. The method of claim 15, wherein the first, second, third, and fourth protruding structures protrude out of an isolation structure, and wherein the etching comprises etching a trench in the isolation structure, the trench circumferentially surrounding the second photoresist layer in a top view.

18. The method of claim 15, wherein the dielectric layer is formed by a deposition process, wherein a temperature of the deposition process is below a temperature that would cause a photoresist to carbonize.

19. The method of claim 15, wherein the first and second photoresist layers are formed such that a gap exists between the first and second photoresist layers.

20. The method of claim 15, wherein the providing the semiconductor device comprises forming a FinFET device that includes first, second, third, and fourth fins as the first, second, third, and fourth protruding structures.

* * * * *